(12) United States Patent
Hirata

(10) Patent No.: US 10,223,950 B2
(45) Date of Patent: Mar. 5, 2019

(54) DISPLAY PANEL

(71) Applicant: Panasonic Liquid Crystal Display Co., Ltd., Hyogo (JP)

(72) Inventor: Masafumi Hirata, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 65 days.

(21) Appl. No.: 15/158,516

(22) Filed: May 18, 2016

(65) Prior Publication Data

US 2017/0337859 A1    Nov. 23, 2017

(30) Foreign Application Priority Data

May 19, 2015    (JP) ................................. 2015-101963

(51) Int. Cl.
*G09G 3/00*    (2006.01)
*G09G 3/36*    (2006.01)

(52) U.S. Cl.
CPC ......... *G09G 3/006* (2013.01); *G09G 2300/02* (2013.01); *G09G 2300/0413* (2013.01); *G09G 2300/0426* (2013.01); *G09G 2310/0264* (2013.01); *G09G 2310/0281* (2013.01); *G09G 2330/12* (2013.01)

(58) Field of Classification Search
CPC .... G09G 3/006; G09G 3/3677; G09G 3/3688; G09G 2330/08; G09G 2330/10; G09G 2330/12; G09G 2300/02; G09G 2300/0413; G09G 2300/0426; G09G 2310/0264; G09G 2310/0281; G02F 1/1345; G02F 1/1368; G02F 1/136277; G01R 31/2801; H01L 27/124
See application file for complete search history.

(56) References Cited

U.S. PATENT DOCUMENTS

| 7,956,976 | B1 * | 6/2011 | Hayata | G09G 3/006 349/149 |
| 9,722,002 | B2 * | 8/2017 | Kim | H01L 27/3223 |
| 2008/0123005 | A1 * | 5/2008 | Sohn | G02F 1/1309 349/40 |
| 2011/0018571 | A1 * | 1/2011 | Kim | G02F 1/1345 324/760.02 |
| 2016/0240141 | A1 * | 8/2016 | Lee | G02F 1/13454 |

FOREIGN PATENT DOCUMENTS

JP    2008-216894 A    9/2008

* cited by examiner

*Primary Examiner* — Sardis F Azongha
(74) *Attorney, Agent, or Firm* — HEA Law PLLC

(57) ABSTRACT

Provided is a display panel, including: a display region having an anomaly shape; a plurality of first test transistors; a plurality of second test transistors; and test control signal supply wiring through which a control signal for turning on or off the first and second test transistors is to be supplied, in which first test transistors connected to gate lines crossing an anomaly part of the anomaly shape and second test transistors connected to data lines crossing the anomaly part are arranged in other patterns than a straight line, and in which the test control signal supply wiring includes first test control signal supply wiring, which is connected to control electrodes of the plurality of first test transistors, and second test control signal supply wiring, which is branched out from the first test control signal supply wiring and is connected to control electrodes of the plurality of second test transistors.

16 Claims, 13 Drawing Sheets

DISPLAY PANEL

CROSS-REFERENCE TO RELATED APPLICATION

The present application claims priority from Japanese application JP 2015-101963 filed on May 19, 2015, the content of which is hereby incorporated by reference into this application.

BACKGROUND

1. Technical Field

This application relates to a display panel, and more particularly, to a display panel having an anomaly shape.

2. Description of the Related Art

Display panels such as liquid crystal panels have various uses in recent years, for example, as a panel for displaying meters and similar instruments on a vehicle (an instrument panel). With the diversification of uses, display panels (or display regions) of anomaly shapes which have other outer shapes than a quadrangular one are being proposed. Examples of display panels having an anomaly shape include display panels in which at least one of the four corner portions is arc-shaped, and display panels that overall have a trapezoidal shape, an oval shape, a circular shape, or a polygonal shape. A display panel having an anomaly shape is disclosed in Japanese Patent Application Laid-open No. 2008-216894.

Hitherto, there have also been proposed display panels having a configuration for detecting a wiring defect in gate lines, data lines, and other wiring lines. For example, a display panel includes a plurality of test transistors connected to gate lines and a plurality of test transistors connected to data lines. The test transistors are turned on in a step of testing the display panel, and test signals (test gate signals and test data signals) are input to detect wiring breakage or the like based on a state in which a pixel corresponding to a test wiring line is on.

SUMMARY

In general, the test transistors and test wiring lines through which the test signals are supplied are arranged in a frame region around the display region. This makes the frame region large in size in a display panel having the configuration for conducting the test described above. In particular, employing the configuration for conducting the test in a display panel having an anomaly shape complicates the arrangement of the test transistors and the test wiring lines, which gives rise to additional problems besides the problem of a large frame region, for example, a failure to conduct an accurate test due to an unintended contact between one test wiring line and another.

The present application has been made in view of the problems described above, and an object of the present application is therefore to provide a display panel that includes a display region having an anomaly shape and test transistors and test wiring lines arranged in a frame region, and is capable of reducing the area of the frame region and also executing a test of the display panel without fail.

In order to solve the above-mentioned problems, according to one embodiment of this application, there is provided a display panel, including: a display region having an anomaly shape; a plurality of gate lines extending in a row direction; a plurality of data lines extending in a column direction; a plurality of first test transistors connected to the plurality of gate lines; a plurality of second test transistors connected to the plurality of data lines; and test control signal supply wiring through which a control signal for turning on the plurality of first test transistors and the plurality of second test transistors and a control signal for turning off the plurality of first test transistors and the plurality of second test transistors are to be supplied, in which first test transistors among the plurality of the first test transistors connected to gate lines crossing an anomaly part of the anomaly shape of the display region among the plurality of gate lines are arranged in other patterns than a straight line, and second test transistors among the plurality of the second test transistors connected to data lines crossing the anomaly part among the plurality of date lines are arranged in other patterns than a straight line, the anomaly part being formed in a non-straight line shape or a curve line shape and in which the test control signal supply wiring includes first test control signal supply wiring, which is connected to control electrodes of the plurality of first test transistors, and second test control signal supply wiring, which is branched out from the first test control signal supply wiring and is connected to control electrodes of the plurality of second test transistors.

In the display panel according to the one embodiment of this application, when the plurality of data lines are longer than the plurality of gate lines, the second test transistors among the plurality of the second test transistors connected to the data lines crossing the anomaly part may be placed closer to outside than the first test transistors among the plurality of the first test transistors connected to the gate lines crossing the anomaly part are to the outside, and, when the plurality of gate lines are longer than the plurality of data lines, the first test transistors among the plurality of the first test transistors connected to the gate lines crossing the anomaly part may be placed closer to the outside than the second test transistors among the plurality of the second test transistors connected to the data lines crossing the anomaly part are to the outside.

In the display panel according to the one embodiment of this application, the second test control signal supply wiring may be placed closer to the outside than the first test control signal supply wiring is to the outside.

In the display panel according to the one embodiment of this application, the first test control signal supply wiring may be placed closer to the outside than the second test control signal supply wiring is to the outside.

In the display panel according to the one embodiment of this application, a branching point of the first test control signal supply wiring and the second test control signal supply wiring may be located closer to outside than a first gate line, which is arranged at a far end of the display region as an outermost line among the plurality of gate lines, is to the outside.

In the display panel according to the one embodiment of this application, a branching point of the first test control signal supply wiring and the second test control signal supply wiring may be located between a first gate line, which is arranged at a far end of the display region as an outermost line among the plurality of gate lines, and a second test transistor that is closest to the first gate line among the plurality of second test transistors that are closer to the outside than the first gate line is to the outside.

In the display panel according to the one embodiment of this application, the plurality of second test transistors may be grouped into a group of at least two second test transistors, and the at least two second test transistors in each group may be aligned in a single file in the row direction, and a plurality of groups of the at least two second test transistors connected to the data lines crossing the anomaly part may be arranged in other patterns than a straight line.

In the display panel according to the one embodiment of this application, the plurality of first test transistors may be grouped into a group of at least two first test transistors, and the at least two first test transistors in each group may be aligned in a single file in the column direction, and a plurality of groups of the at least two first test transistors connected to the gate lines crossing the anomaly part may be arranged in other patterns than a straight line.

In the display panel according to the one embodiment of this application, the plurality of groups of the at least two second test transistors may each be arranged between two adjacent gate lines out of the plurality of gate lines.

In the display panel according to the one embodiment of this application, the plurality of groups of the at least two first test transistors may each be arranged between two adjacent data lines out of the plurality of data lines.

In the display panel according to the one embodiment of this application, a branching point of the first test control signal supply wiring and the second test control signal supply wiring may be located along a center line in the row direction of the display region.

The display panel according to the one embodiment of this application may further include off-voltage transmission wiring through which an off-voltage for fixing the plurality of first test transistors and the plurality of second test transistors to an off state is to be supplied to the control electrodes of the plurality of first test transistors and the plurality of second test transistors, and the off-voltage transmission wiring may be electrically connected to the first test control signal supply wiring.

In the display panel according to the one embodiment of this application, a connection point where the off-voltage transmission wiring is connected to the first test control signal supply wiring and a branching point of the first test control signal supply wiring and the second test control signal supply wiring may be located so as to be symmetrical with respect to the row direction in the display region.

In the display panel according to the one embodiment of this application, a connection point where the off-voltage transmission wiring is connected to the first test control signal supply wiring and a branching point of the first test control signal supply wiring and the second test control signal supply wiring may be located at the same position.

According to one embodiment of this application, there is provided a display panel, including: a display region having an anomaly shape; a plurality of gate lines extending in a row direction; a plurality of data lines extending in a column direction; a plurality of first test transistors connected to the plurality of gate lines; and a plurality of second test transistors connected to the plurality of data lines, in which, out of a set of first test transistors among the plurality of the first test transistors connected to gate lines crossing an anomaly part of the anomaly shape of the display region among the plurality of gate lines are arranged in other patterns than a straight line and a set of second test transistors among the plurality of the second test transistors connected to data lines crossing the anomaly part among the plurality of date lines are arranged in other patterns than a straight line, one set of the test transistors is placed closer to outside than another set of the test transistors is to the outside, and at least one test transistor out of the another set of the test transistors is arranged between two adjacent wiring lines, out of the plurality of gate lines and the plurality of data lines, that are connected to the one set of the test transistors, the anomaly part being formed in a non-straight line shape or a curve line shape.

DETAILED DESCRIPTION

An embodiment of the present application is described below with reference to the drawings. The embodiment of the present application takes a liquid crystal display device as an example of a display device of the present application. However, the present application is not limited thereto and the display device may be an organic EL display device, for example.

Figure 1:
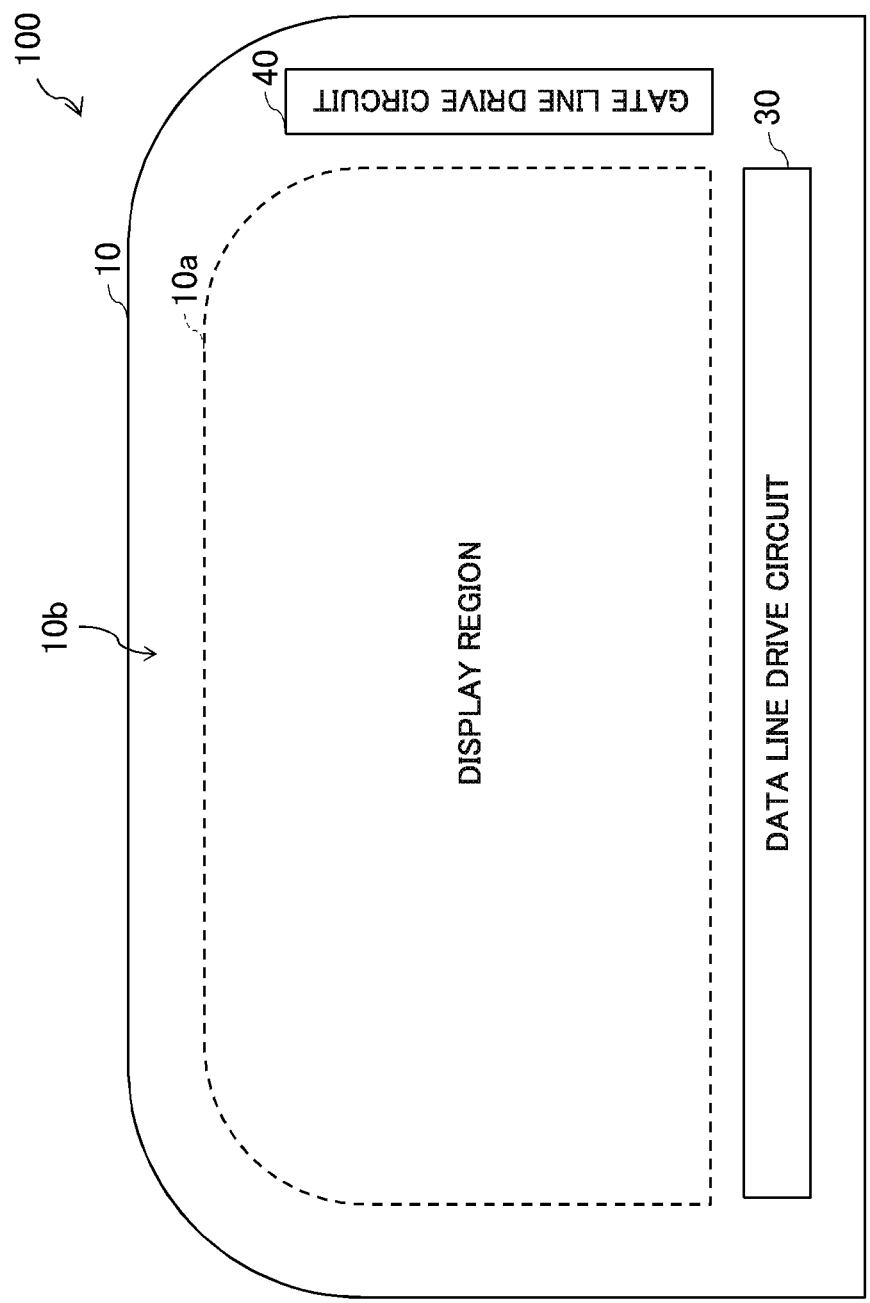
FIG. 1 is a plan view for illustrating a schematic configuration of a liquid crystal display device according to an embodiment of the present application.

FIG. 1 is a plan view for illustrating a schematic configuration of the liquid crystal display device according to this embodiment. A liquid crystal display device 100 includes a display panel 10, a data line drive circuit 30, a gate line drive circuit 40, and a backlight unit (not shown). The data line drive circuit 30 may include a plurality of source driver ICs, and may be provided outside of the display panel 10. The gate line drive circuit 40 may include a plurality of gate driver ICs, and may be provided outside of the display panel 10. Although not shown, a timing controller configured to control the operation of the data line drive circuit 30 and the gate line drive circuit 40 may be provided inside or outside of the display panel 10.

Figure 2:
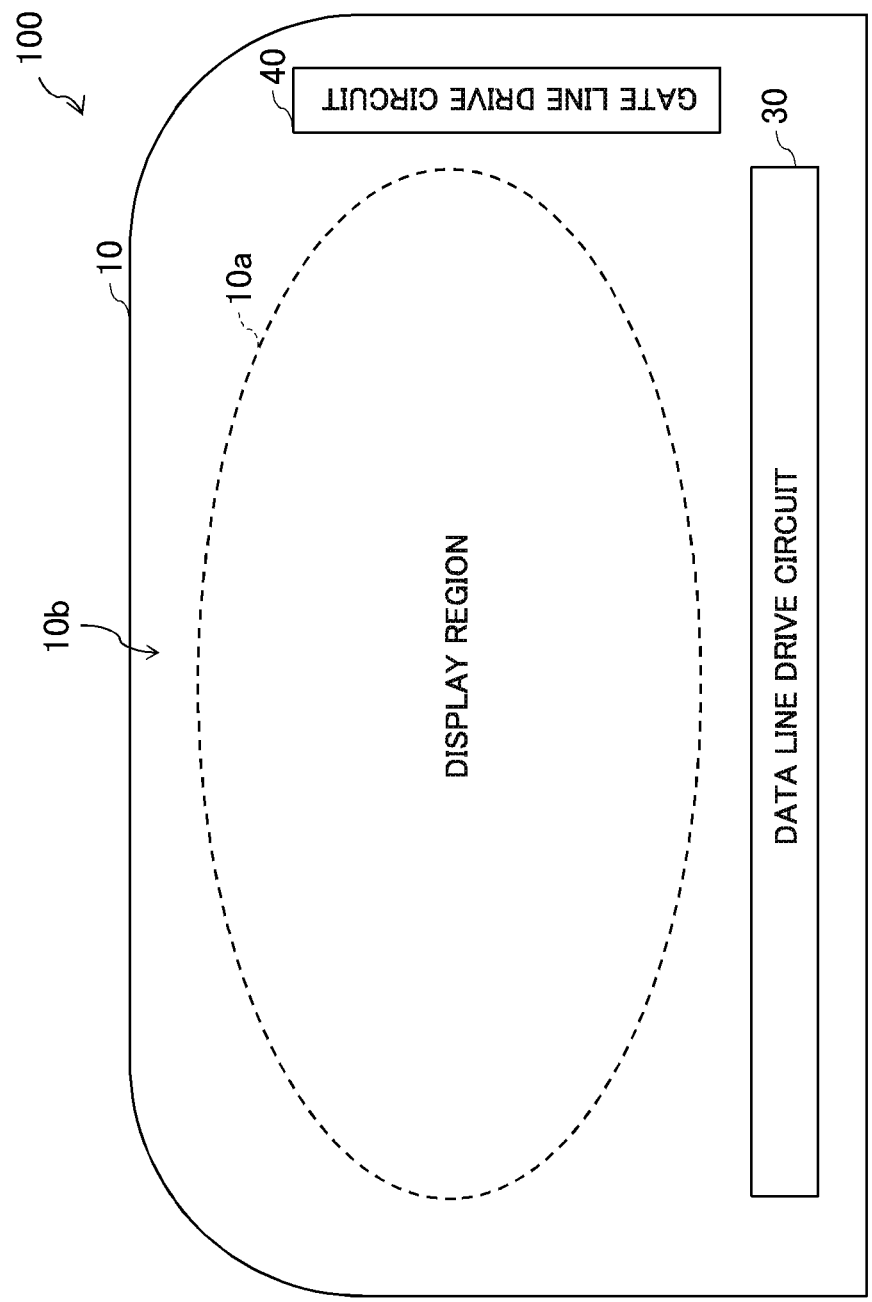
FIG. 2 is a plan view for illustrating another schematic configuration of the liquid crystal display device.

The display panel 10 is roughly divided into a display region 10a where images are displayed and a frame region 10b around the display region 10a. The display region 10a has four corner portions, and of the four corner portions, two upper corner portions are arc-shaped. The shape of the display region 10a is not limited to the one illustrated in FIG. 1, and may be trapezoidal, oval, circular, or polygonal, for example. In short, the display region 10a is formed to have an anomaly shape. The display panel 10 has an anomaly shape as well to accommodate the shape of the display region 10a. In the liquid crystal display device 100 according to this embodiment, at least one of the display panel 10 and the display region 10a needs to have an anomaly shape. For example, the liquid crystal display device 100 illustrated in FIG. 2 includes the display panel 10 in which two corner portions are arc-shaped and the display region 10a that is formed into an oval shape. The liquid crystal display device 100 illustrated in FIG. 3 includes the display panel 10 in which all four corner portions are arc-shaped and the display region 10a that is formed into a quadrangular shape.

Figure 4:
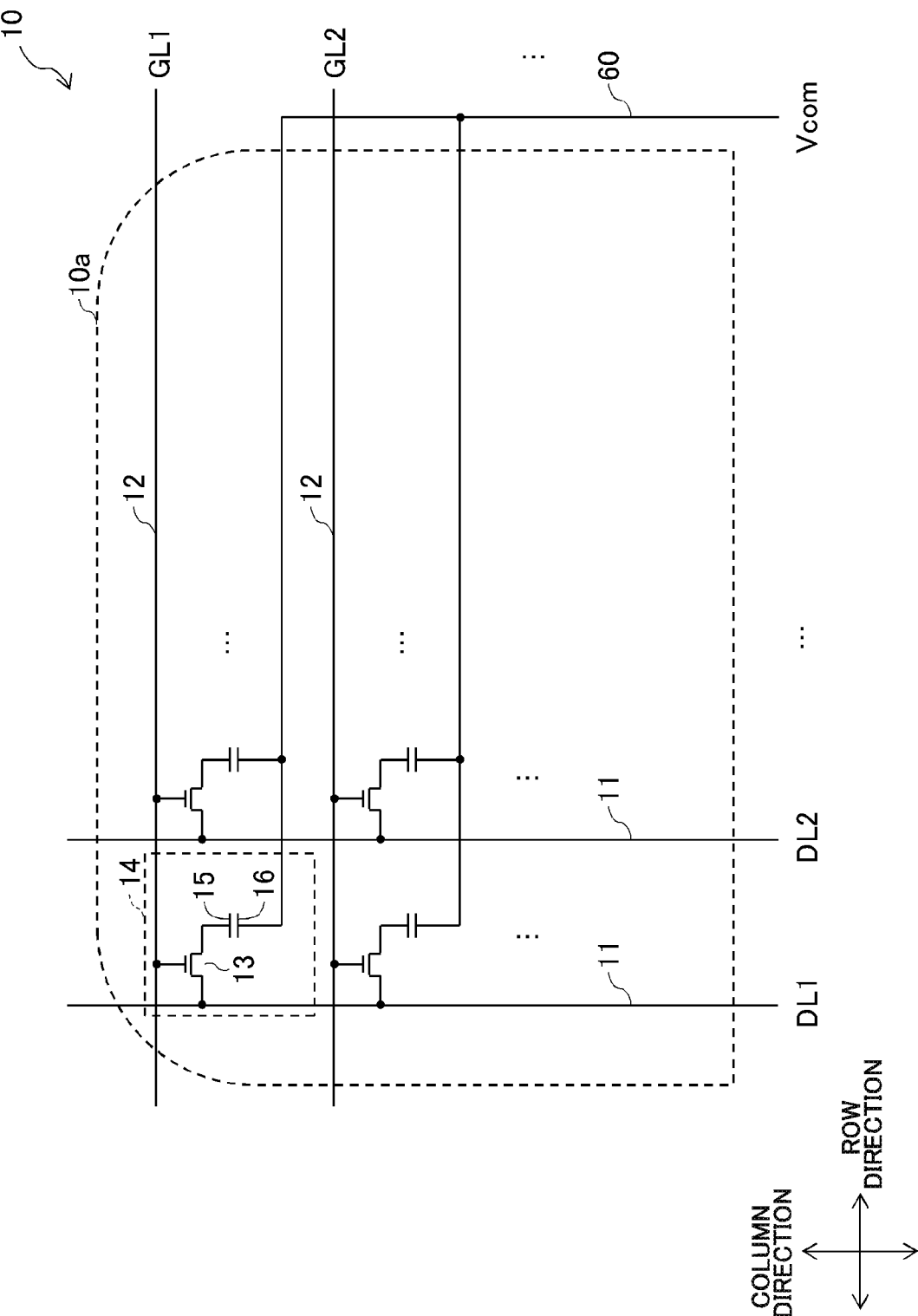
FIG. 4 is an equivalent circuit diagram for illustrating a schematic configuration of a display panel according to the embodiment.

FIG. 4 is an equivalent circuit diagram for illustrating a schematic configuration of the display device 10. The display panel 10 includes a plurality of data lines 11 (DL1, DL2, . . . ) extending in a column direction, and a plurality of gate lines 12 (GL1, GL2, . . . ) extending in a row direction. A thin film transistor 13 (TFT) is formed at each intersecting portion between each data line 11 and each gate line 12. Each data line 11 is connected to the data line drive circuit 30. Each gate line 12 is connected to the gate line drive circuit 40.

The display panel 10 includes a plurality of pixels 14 arranged in matrix (in the row direction and the column direction) so as to correspond to each intersecting portion between each data line 11 and each gate line 12. Note that, although not shown, the display panel 10 includes a thin film transistor substrate (TFT substrate), a color filter substrate (CF substrate), and a liquid crystal layer sandwiched between both the substrates. The TFT substrate includes a plurality of pixel electrodes 15 arranged so as to correspond to the respective pixels 14. The CF substrate includes a common electrode 16 common to the respective pixels 14. Note that, the common electrode 16 may be formed on the TFT substrate.

Each data line 11 is supplied with a data signal (data voltage) from the line drive circuit 30. Each gate line 12 is supplied with gate signals (a gate on-voltage and a gate off-voltage) from the gate line drive circuit 40. The common electrode 16 is supplied with a common voltage Vcom from a common electrode drive circuit (not shown) via common wiring 60. When a gate on-voltage is supplied to the gate line 12, the thin film transistor 13 connected to the gate line 12 is turned on so that the data voltage is supplied to the pixel electrode 15 via the data line 11 connected to the thin film transistor 13. An electric field is generated by the difference between the data voltage supplied to the pixel electrode 15 and the common voltage Vcom supplied to the common electrode 16. This electric field is used to drive the liquid crystal and control the transmittance of light from the backlight unit. In this manner, an image is displayed. Note that, in the case of color display, the color display is realized by supplying desired data voltages to the data lines 11 connected to the respective pixel electrodes 15 of the pixels 14 corresponding to respective red color, green color, and blue color formed of stripe-shaped color filters.

The liquid crystal display device 100 has a configuration for detecting a defect in the display panel 10, for example, a wiring breakage in the data lines 11 and the gate lines 12. Details of this configuration are described below.

Figure 5:
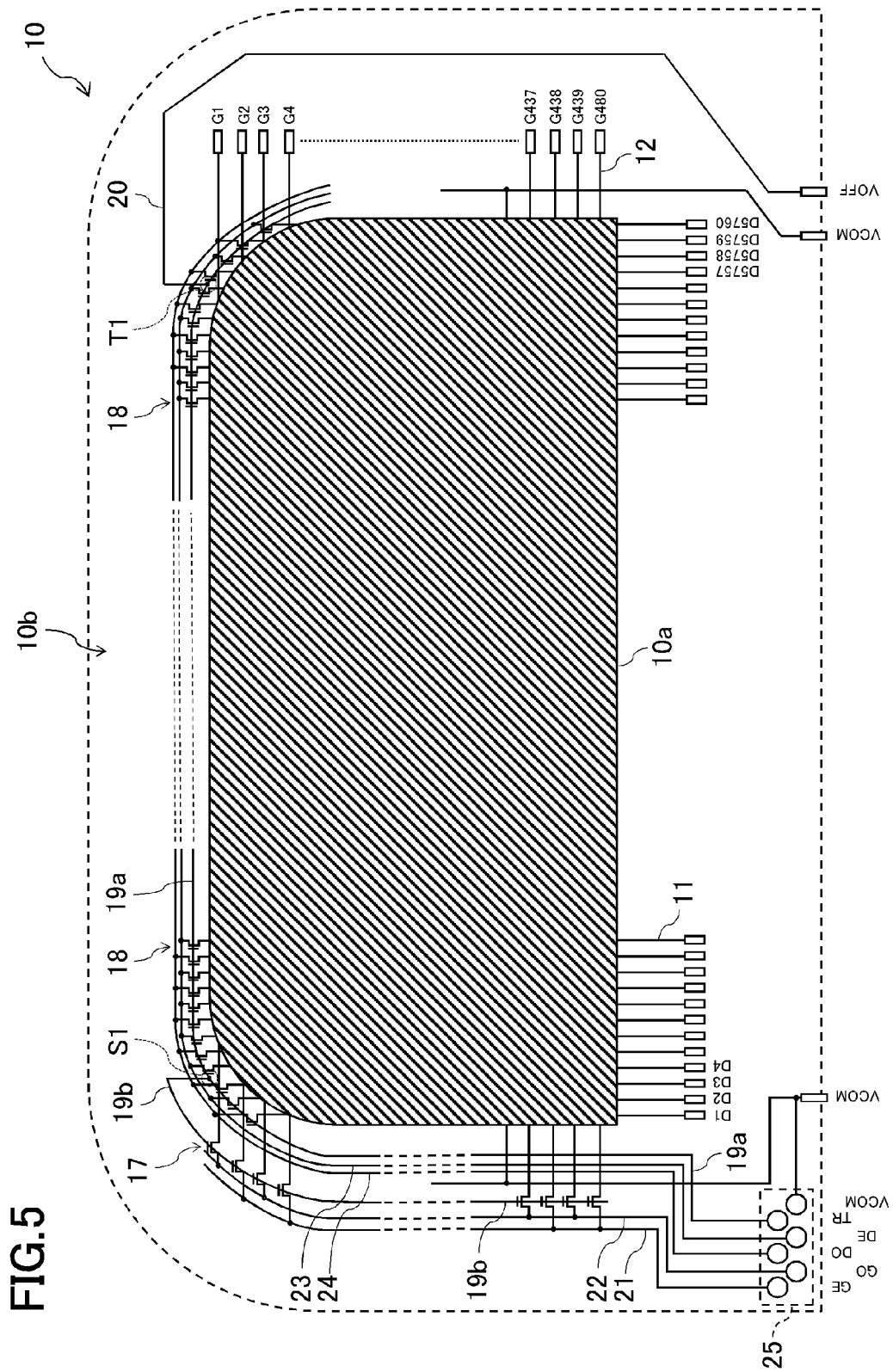
FIG. 5 is a plan view for illustrating a detailed configuration of the display panel

FIG. 5 is a plan view for illustrating a detailed configuration of the display panel 10. For conveniences' sake, the configuration illustrated in FIG. 5 is the one that the display panel 10 has before the data line drive circuit 30 and the gate line drive circuit 40 are installed. The frame region 10b of the display panel 10 includes a plurality of test transistors 17 (first test transistors) having one set of conducting electrodes (source/drain electrodes) connected to the gate lines 12, a plurality of test transistors 18 (second test transistors) having one set of conducting electrodes (source/drain electrodes) connected to the data lines 11, test control signal supply wiring 19 through which control electrodes (gate electrodes) are supplied with test control signals for controlling the turning on/off of the test transistors 17 and 18, test gate signal supply wiring 21 through which test gate signals Ge (a gate on-voltage and a gate off-voltage) are supplied to the other set of the conducting electrodes of the test transistors 17 that are in even-numbered rows, test gate signal supply wiring 22 through which test gate signals Go (a gate on-voltage and a gate off-voltage) are supplied to the other set of the conducting electrodes of the test transistors 17 that are in odd-numbered rows, a plurality of test data signal supply wiring lines 23 through which a test data signal DE is supplied to the other set of the conducting electrodes of the test transistors 18 that are in even-numbered columns, and a plurality of test data signal supply wiring lines 24 through which a test data signal DO is supplied to the other set of the conducting electrodes of the test transistors 18 that are in odd-numbered columns. In a region next to the shorter side of the display region 10a on the left (the left side), the test transistors 17 are arranged in straight lines along the shorter side. In a region next to the arc-shaped corner portion that extends from the shorter side toward the upper longer side (the upper side) of the display region 10a, the test transistors 17 are arranged in a staircase pattern instead of straight lines. One test transistor 17 is connected to each gate line 12. In a region next to the longer side of the display region 10a, the test transistors 18 are arranged in straight lines along the longer side. In regions next to the two arc-shaped corner portions that extend from the longer side toward the left shorter side and right shorter side of the display region 10a, the test transistors 18 are arranged in a staircase pattern instead of straight lines. One test transistor 18 is connected to each data line 11. Details of the arrangement of the test transistors 17 and 18 are described later.

It is preferred to place the test transistors that are arranged along the shorter side of the display region 10a closer to the outside than the test transistors that are arranged along the longer side of the display region 10a are to the outside. In FIG. 5, the test transistors 17, which are arranged along the shorter side, are placed closer to the outside than the test transistors 18, which are arranged along the longer side, are to the outside. In a peripheral portion of the frame region of the display panel 10 (in FIG. 5, the right-hand side of the lower side of the display panel 10), a terminal VOFF (an off-voltage input terminal) is provided through which a gate off-voltage Voff for turning the test transistors 17 and 18 off is input. The gate off-voltage Voff may be output from the common electrode drive circuit, which is installed in the display panel 10.

The test control signal supply wiring 19 has one end connected to a control signal input pad TR, which is provided on the left-hand side of the lower side of the display panel 10, and branches into two near a corner portion of the upper side of the display panel 10. Specifically, the test control signal supply wiring 19 is comprised of first test control signal supply wiring 19a and second test control signal supply wiring 19b. The first test control signal supply wiring 19a extends from the control signal input pad TR along the shape of the display region 10a, i.e., along the left side of the display region 10a, the upper left arc-shaped corner portion, the upper side of the display region 10a, and the upper right arc-shaped corner portion. The second test control signal supply wiring 19b branches from the first test control signal supply wiring 19a at a point (a branching point S1), and doubles back at the branching point S1 to extend along the shape of the display region 10*a*, i.e., along the upper left arc-shaped corner portion and the left side of the display region 10*a*. The first test control signal supply wiring 19*a* is connected to control electrodes of the plurality of test transistors 18, which are connected to the plurality of data lines 11. The second test control signal supply wiring 19*b* is connected to control electrodes of the plurality of test transistors 17, which are connected to the plurality of gate lines 12. The first test control signal supply wiring 19*a* and the second test control signal supply wiring 19*b* are formed in the same layer.

It is preferred for the branching point S1 to be located in the vicinity of the vertex of the arc-shaped corner portion (on the upper side of the display surface), specifically, a connection point between the upper side of the display region 10*a* which is a straight line and the arc-shaped side, for example. It is also preferred to position the branching point S1 closer to the outside than the gate line 12 that is arranged at the far end of the display region 10*a* as the outermost line among the plurality of gate lines 12 (a first gate line GL1) (here, above the topmost gate line 12) is to the outside as illustrated in FIG. 5. This can prevent a contact between the second test control signal supply wiring 19*b*, which is led out of the branching point S1, and another wiring line. The branching point S1 that is preferred is located as illustrated in FIG. 5 between the first gate line GL1 and the test transistor 18 that is closest to the first gate line GL1 among a plurality of test transistors 18 that are closer to the outside than the first gate line GL is to the outside (here, above the first gate line GL). This can minimize the length of the second test control signal supply wiring 19*b*. The position of the branching point S1 is not limited to the one described above.

When a test control signal is supplied to the test control signal supply wiring 19 from the outside via the control signal input pad TR, the test transistors 17 and 18 are all turned on or off at once.

The test gate signal supply wiring 21 is connected to a gate signal input pad GE, which is arranged in the left-hand side of the lower side of the display panel 10. The test gate signal supply wiring 22 is connected to a gate signal input pad GO, which is arranged in the left-hand side of the lower side of the display panel 10. The test gate signal supply wiring 21 is electrically connected via a plurality of test transistors 17 that are in even-numbered columns to a plurality of gate lines 12 that are in even-numbered columns. The test gate signal supply wiring 22 is electrically connected via a plurality of test transistors 17 that are in odd-numbered columns to a plurality of gate lines 12 that are in odd-numbered columns. When the test transistors 17 are turned on and a test gate signal is supplied to the test gate signal supply wiring 21 from the outside via the gate signal input pad GE, the test gate signal is supplied to the plurality of gate lines 12 that are in even-numbered columns via the test transistors 17 that are in even-numbered columns. When the test transistors 17 are turned on and a test gate signal is supplied to the test gate signal supply wiring 22 from the outside via the gate signal input pad GO, the test gate signal is supplied to the plurality of gate lines 12 that are in odd-numbered columns via the test transistors 17 that are in odd-numbered columns.

The test data signal supply wiring 23 is connected to a data signal input pad DE, which is provided on the left-hand side of the lower side of the display panel 10. The test data signal supply wiring 24 is connected to a data signal input pad DO, which is provided on the left-hand side of the lower side of the display panel 10. The test data signal supply wiring 23 is electrically connected to a plurality of data lines 11 that are in even-numbered columns via a plurality of test transistors 18 that are in even-numbered columns. The test data signal supply wiring 24 is electrically connected to a plurality of data lines 11 that are in odd-numbered columns via a plurality of test transistors 18 that are in odd-numbered columns. When the test transistors 18 are turned on and a test data signal is supplied from the outside to the test data signal supply wiring 23 via the data signal input pad DE, the test data signal is supplied to the plurality of data lines 11 that are in even-numbered columns via the test transistors 18 that are in even-numbered columns. When the test transistors 18 are turned on and a test data signal is supplied from the outside to the test data signal supply wiring 24 via the data signal input pad DO, the test data signal is supplied to the plurality of data lines 11 that are in odd-numbered columns via the test transistors 18 that are in odd-numbered columns.

The pads described above are included in a test signal input pad 25, which is arranged in the peripheral portion of the display panel 10 (in FIG. 5, on the left-hand side of the lower side of the display panel 10). The position of the test signal input pad 25 is not limited, and how many test signal input pads 25 are provided is not limited. Test equipment (not shown) configured to generate and output various test signals is connected to the test signal input pad 25.

Figure 6:
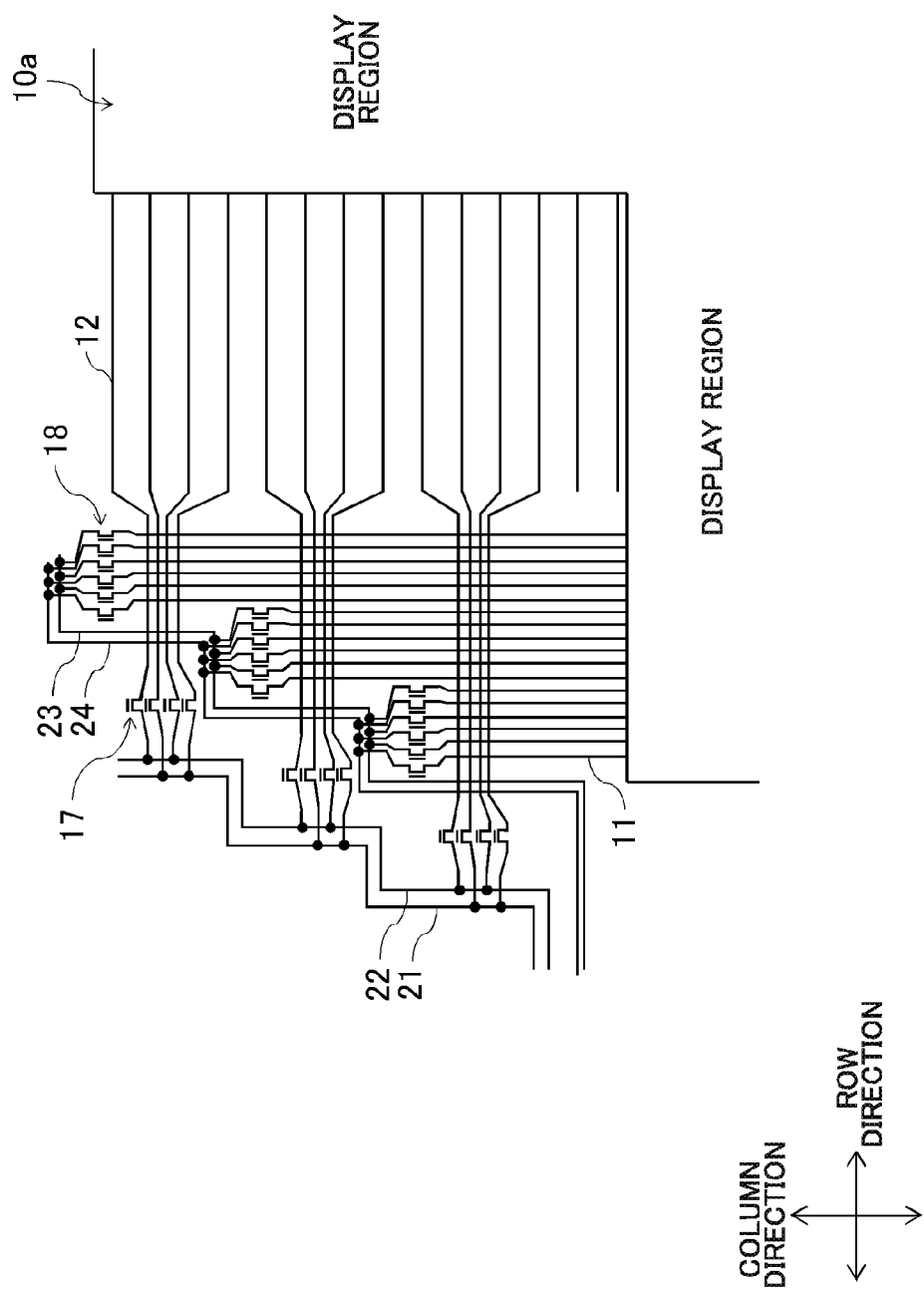
FIG. 6 is an equivalent circuit diagram in which a part of FIG. 5 is enlarged.

FIG. 6 is an equivalent circuit diagram in which the upper left corner portion of FIG. 5 is enlarged. For conveniences' sake, the test control signal supply wiring 19 is omitted from FIG. 6. As illustrated in FIG. 6, the plurality of test transistors 17 are grouped into a group of four, and the four test transistors 17 in each group are aligned in a single file in the column direction. A plurality of groups of test transistors 17 are arranged in an oblique direction in a region next to the arc-shaped corner portion of the display region 10*a*. The plurality of test transistors 18 are grouped into a group of six, and the six test transistors 18 in each group are aligned in a single file in the row direction. A plurality of groups of test transistors 18 are arranged in an oblique direction in the region next to the arc-shaped corner portion of the display region 10*a*. Four gate lines 12 that are associated with one group of test transistors 17 are arranged so as to pass through a region between two groups of test transistors 18 that are adjacent to each other in the column direction. One group of test transistors 18 is arranged in a region between two groups of test transistors 17 that are adjacent to each other in the column direction. Groups of test transistors 17 are alternated with groups of test transistors 18 in the column direction. The number of test transistors that are included in a group is not limited.

Figure 7:
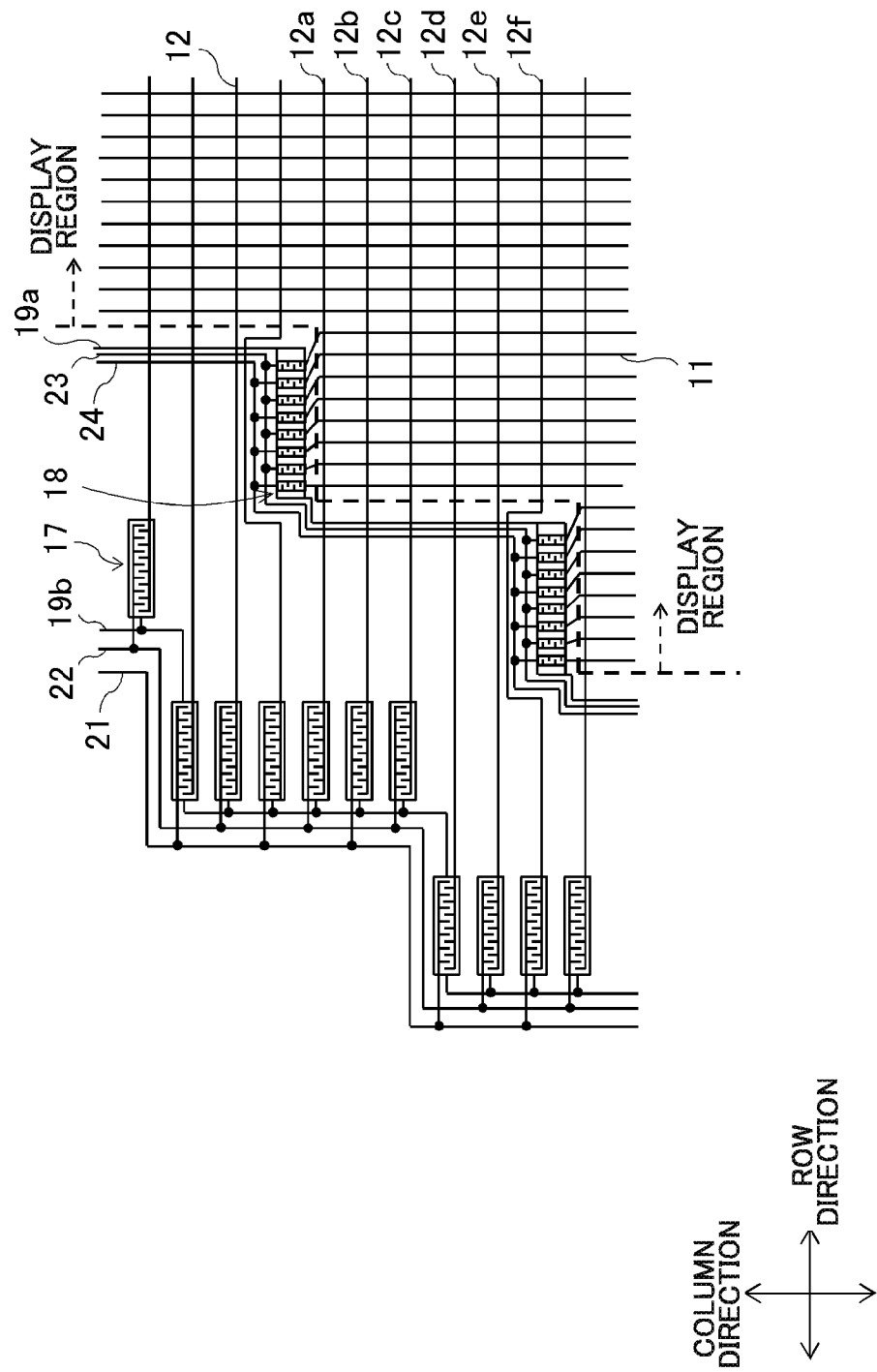
FIG. 7 is a detailed plan view in which a part of FIG. 5 is enlarged.

FIG. 7 is a detailed plan view in which the upper left corner portion of FIG. 5 is enlarged. The configuration illustrated in FIG. 7 differs from the configuration illustrated in FIG. 6 in the arrangement of the test transistors 17 and 18. In the configuration of FIG. 7, one group of test transistors 18 (eight test transistors 18 constitute one group in FIG. 7) is arranged in a region between two gate lines 12 connected to two test transistors 17 that are adjacent to each other in the column direction. A plurality of gate lines 12 (gate lines 12*a* to 12*f* of FIG. 7) associated with two groups of test transistors 17 that are adjacent to each other in the column direction are arranged in a region between two groups of test transistors 18 that are adjacent to each other in the column direction.

Of the data lines and the gate lines, wiring lines connected to the test transistors that are arranged along the shorter side of the display region 10*a* are longer than wiring lines connected to the test transistors that are arranged along the longer side of the display region 10a. The size (channel width) of a transistor in this case is larger when the length of a wiring line connected to the transistor is greater. An increase in transistor size increases the chance for interference between wiring lines. It is therefore preferred in this embodiment to place the test transistors that are arranged along the shorter side of the display region 10a closer to the outside than the test transistors that are arranged along the longer side of the display region 10a are to the outside.

Specifically, the gate lines 12, which are connected to the test transistors 17 arranged along the shorter side of the display region 10a, are longer than the data lines 11, which are connected to the test transistors 18 arranged on the longer side of the display region 10a, in the configuration of FIG. 5. Then, each test transistor 17 is greater in size (channel width) than each test transistor 18 as illustrated in FIG. 7. It is therefore preferred to place the test transistors 17, which are arranged along the shorter side, closer to the outside than the test transistors 18, which are arranged along the longer side, are to the outside. It is also preferred in the configuration of FIG. 5 to place the second test control signal supply wiring 19b closer to the outside than the first test control signal supply wiring 19a is to the outside.

Figure 8:
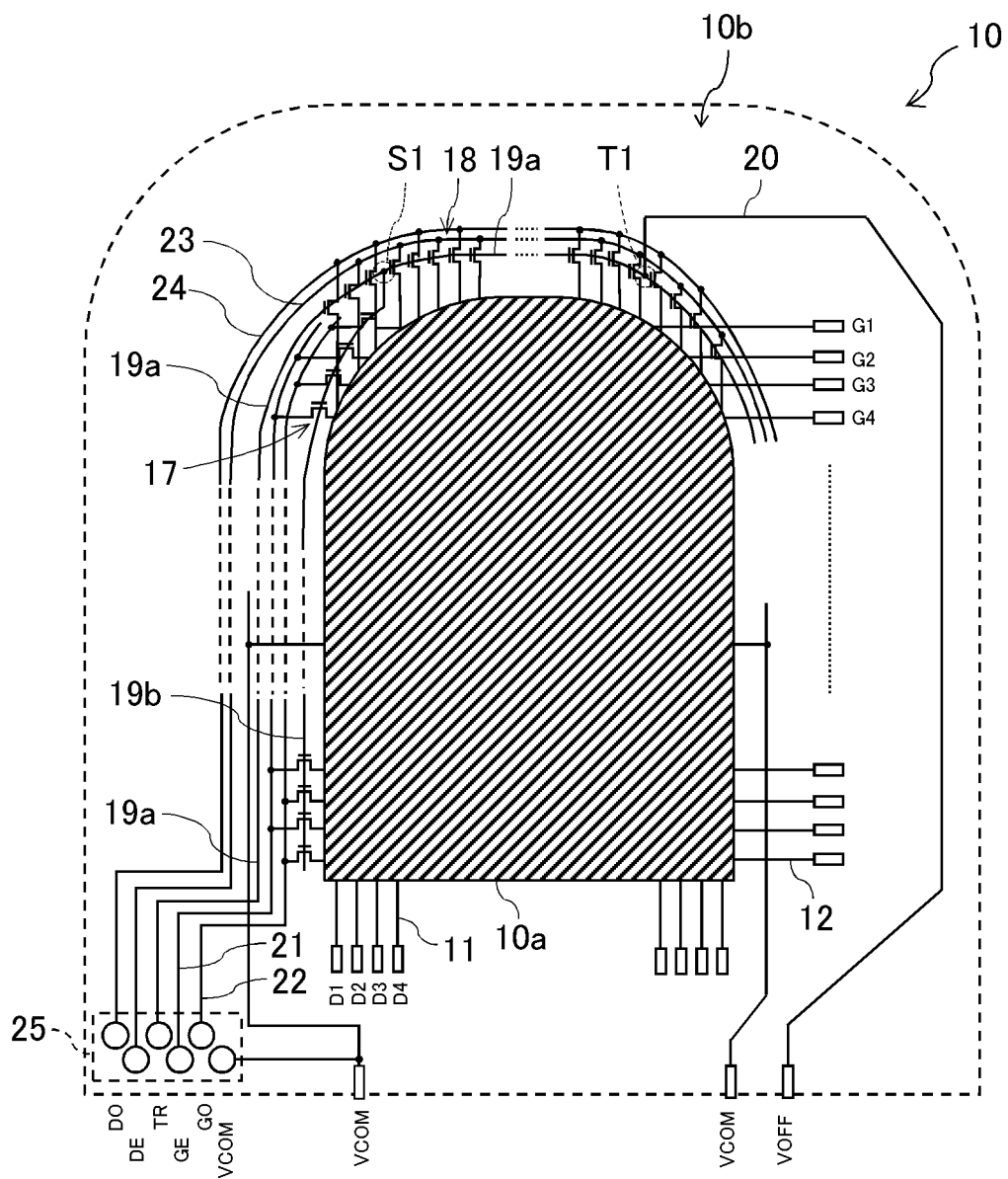
FIG. 8 is a plan view for illustrating another configuration of the display panel.
Figure 9:
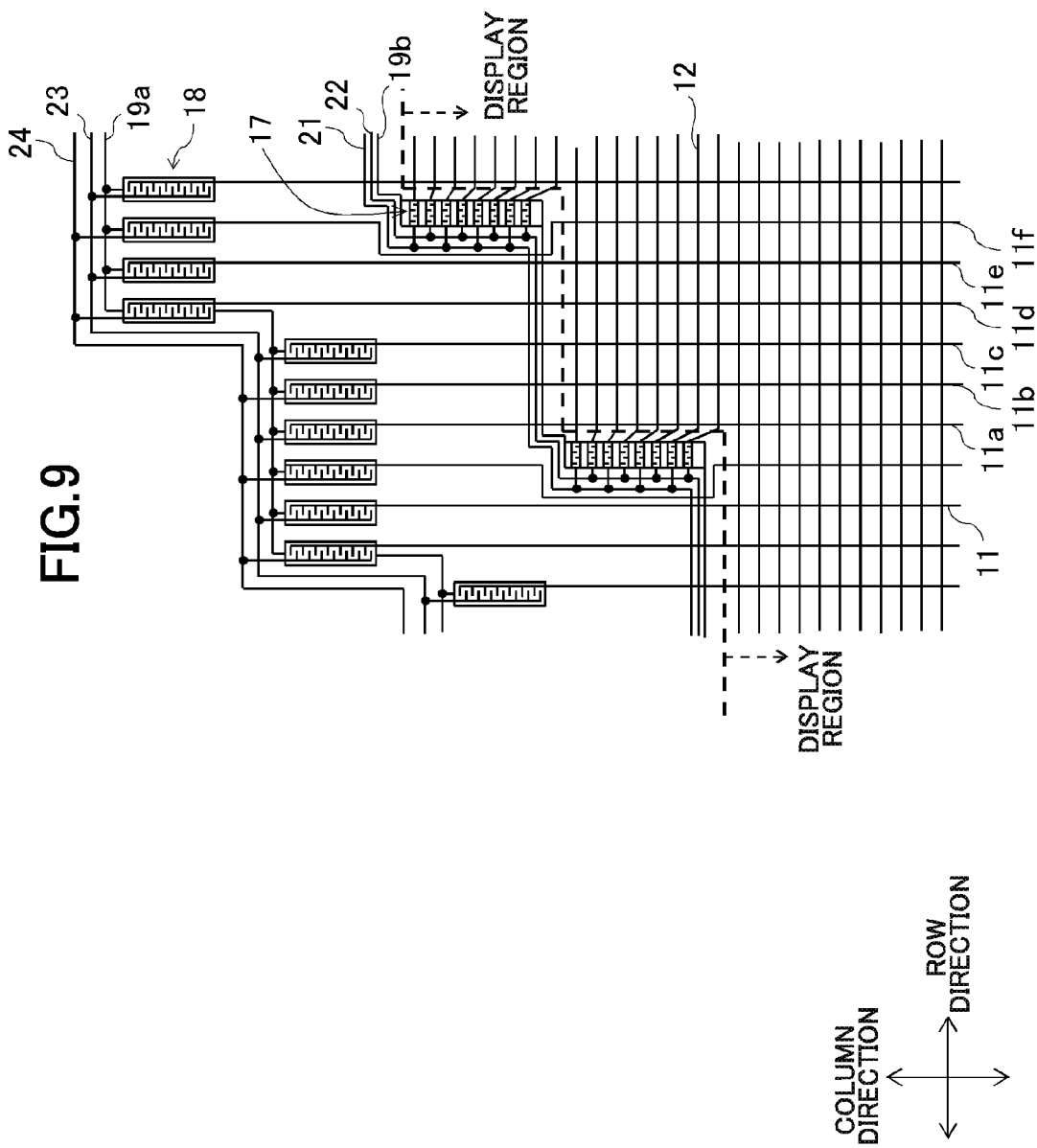
FIG. 9 is a detailed plan view in which a part of FIG. 8 is enlarged.

FIG. 8 is a plan view for illustrating another configuration of the display panel 10. In the configuration of FIG. 8, the display region 10a has a vertically elongated shape, and the test transistors 17 are arranged along a longer side of the display region 10a while the test transistors 18 are arranged along a shorter side of the display region 10a. The data lines 11, which are connected to the test transistors 18 arranged along the shorter side, are accordingly longer than the gate lines 12, which are connected to the test transistors 17 arranged along the longer side. The size (channel width) of each test transistor 18 in this case is greater than the size (channel width) of each test transistor 17 as illustrated in FIG. 9. It is therefore preferred to place the test transistors 18, which are arranged along the shorter side of the display region 10a, closer to the outside than the test transistors 17, which are arranged along the longer side of the display region 10a, are to the outside. It is also preferred in the configuration of FIG. 8 to place the first test control signal supply wiring 19a closer to the outside than the second test control signal supply wiring 19b is to the outside.

In the configuration of FIG. 9, one group of test transistors 17 (eight test transistors 17 constitute one group in FIG. 9) is arranged in a region between two data lines 11 connected to two test transistors 18 that are adjacent to each other in the row direction. A plurality of data lines 11 (data lines 11a to 11f of FIG. 9) associated with two groups of test transistors 18 that are adjacent to each other in the row direction are arranged in a region between two groups of test transistors 17 that are adjacent to each other in the row direction.

Figure 10:
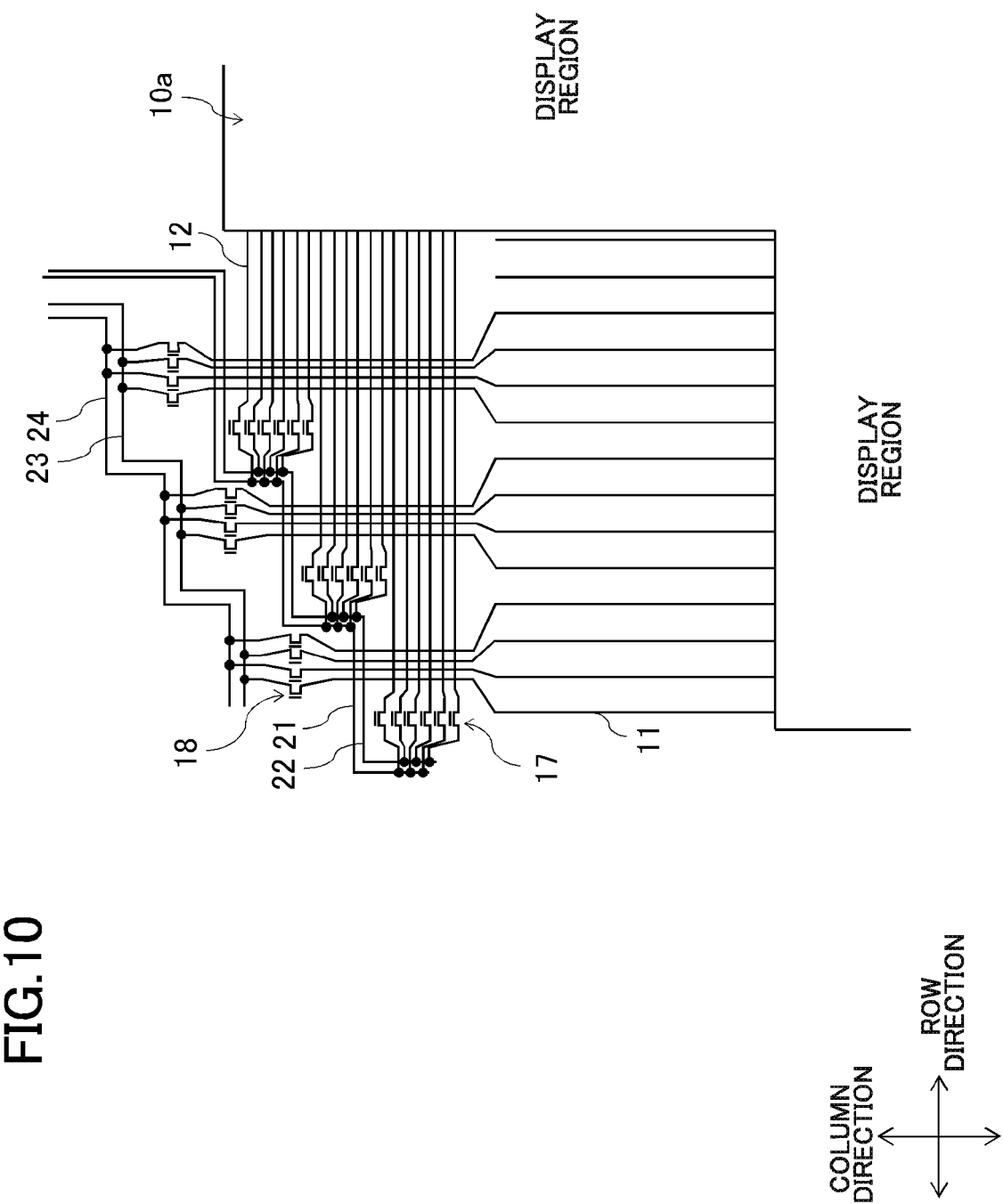
FIG. 10 is an equivalent circuit diagram in which a corner portion of a display region that has a vertically elongated shape is enlarged.

FIG. 10 is an equivalent circuit diagram in which a corner portion of the display region 10a that has a vertically elongated shape is enlarged. As illustrated in FIG. 10, the plurality of test transistors 17 are grouped into a group of six, and the six test transistors 17 in each group are aligned in a single file in the column direction. A plurality of groups of test transistors 17 are arranged in an oblique direction in a region next to the arc-shaped corner portion of the display region 10a. The plurality of test transistors 18 are grouped into a group of four, and the four test transistors 18 in each group are aligned in a single file in the row direction. A plurality of groups of test transistors 18 are arranged in an oblique direction in the region next to the arc-shaped corner portion of the display region 10a. Four data lines 11 that are associated with one group of test transistors 18 are arranged so as to pass through a region between two groups of test transistors 17 that are adjacent to each other in the row direction. One group of test transistors 17 is arranged in a region between two groups of test transistors 18 that are adjacent to each other in the row direction. Groups of test transistors 17 are alternated with groups of test transistors 18 in the row direction. The number of test transistors that are included in a group is not limited.

With the display panel 10 according to this embodiment, where the test transistors 17 and 18 and various test wiring lines are arranged in a pattern that fits the shape of the display region, and the test control signal supply wiring 19 is branched, the area of the frame region can be minimized. In addition, the efficient arrangement of the test transistors 17 and 18 and various test wiring lines can prevent a contact between wiring lines, thereby executing a test of the display panel without fail.

To conduct a test of the display panel 10, test equipment is connected to the test signal input pad 25 in, for example, a test step that is included in a manufacturing process of the display panel 10, and test signals are supplied to the respective test signal supply wiring lines via the test signal input pad 25. Specifically, the test equipment supplies test control signals for controlling the turning on/off of the test transistors 17 and 18 to the test control signal supply wiring 19, supplies the test gate signals Ge to the test gate signal supply wiring 21, supplies the test gate signals Go to the test gate signal supply wiring 22, supplies the test data signal DE to the plurality of test data signal supply wiring lines 23, and supplies the test data signal DO to the plurality of test data signal supply wiring lines 24.

After the test step is finished, the test equipment is disconnected from the test signal input pad 25. Disconnecting the test equipment from the display panel 10 puts the test transistors 17 and 18 in an electrically floating state. The test transistors 17 and 18 may therefore be turned on accidentally while the display device is in normal use (during display operation) due to, for example, the display operation, and a resultant change in pixel potential can cause display troubles. In order to avoid such display troubles, the test transistors 17 and 18 in a floating state need to be fixed to the off state without fail during display operation. The liquid crystal display device 100 in this embodiment clears this requirement by having a configuration that fixes the test transistors 17 and 18 to the off state without fail while the display device is in normal use.

Specifically, the display panel 10 includes gate off-voltage transmission wiring 20 (off-voltage transmission wiring) through which a control signal for turning the test transistors 17 and 18 off (a gate off-voltage) is supplied. The gate off-voltage transmission wiring 20 has one end electrically connected to the terminal VOFF, which is provided in the peripheral portion of the display panel 10 (in FIG. 5, the left-hand side of the lower side), and has the other end electrically connected to the test control signal supply wiring 19 (for example, the first test control signal supply wiring 19a). The gate off-voltage transmission wiring 20 is laid along the outermost edge of the display panel 10 as illustrated in FIG. 5. A connection point T1, where the gate off-voltage transmission wiring 20 is connected to the first test control signal supply wiring 19a, and the branching point S1 are positioned so as to be symmetrical (left to right) with respect to the row direction in the display region 10a. While the position of the connection point T1 is not limited thereto, it is preferred for the connection point T1 to be located above the first gate line GL1.

A gate off-voltage is applied to the terminal VOFF constantly during display operation. The display panel 10 is thus supplied with a gate off-voltage all the time, and the test transistors 17 and 18 can therefore be fixed to the off state during display operation. The display troubles resulting from the accidental turning on of the test transistors 17 and 18 during display operation can be prevented in this manner.

An example of a testing method in the liquid crystal display device 100 is briefly described next. Test equipment is connected to the test signal input pad 25 of the display panel 10 first. Next, a test control signal (a gate on-voltage) is input from the test equipment to the test control signal supply wiring 19 via the control signal input pad TR. This turns the test transistors 17 and 18 on. The test gate signal Go that has a gate on-voltage is next input from the test equipment to the conducting electrodes of the test transistors 17 that are in odd-numbered columns. The gate lines 12 that are in odd-numbered columns are selected as a result. Next, the test data signal DO is supplied from the test equipment via the thin film transistors 13 that are connected to the gate lines 12 in odd-numbered columns to the corresponding pixel electrodes 15. The common voltage Vcom is supplied to the common electrode 16. The display state of the corresponding pixels 14, here, the pixels 14 that are in odd-numbered columns and odd-numbered rows, is thus checked, to thereby detect a wiring defect in gate lines, data lines, or other wiring lines that are associated with the checked pixels 14.

The test equipment subsequently inputs the test gate signal Go that has a gate off-voltage to the conducting electrodes of the test transistors 17 that are in odd-numbered columns, and inputs the test gate signal Ge that has a gate on-voltage to the conducting electrodes of the test transistors 17 that are in even-numbered columns. As a result, the gate lines 12 that are in odd-numbered columns are no longer selected and the gate lines 12 that are in even-numbered columns are selected. The test equipment next supplies the test data signal DE via the thin film transistors 13 that are connected to the gate lines 12 in even-numbered columns to the corresponding pixel electrodes 15. The common voltage Vcom is supplied to the common electrode 16. The display state of the corresponding pixels 14, here, the pixels 14 that are in even-numbered rows and even-numbered columns, is thus checked, to thereby detect a wiring defect in gate lines, data lines, or other wiring lines that are associated with the checked pixels 14. After the test step is finished, the test equipment is disconnected from the test signal input pad 25 of the display panel 10.

The display panel 10 is tested in the test step in this manner. The method of testing the display panel 10 is not limited to the one described above, and known methods can be employed.

Figure 11:
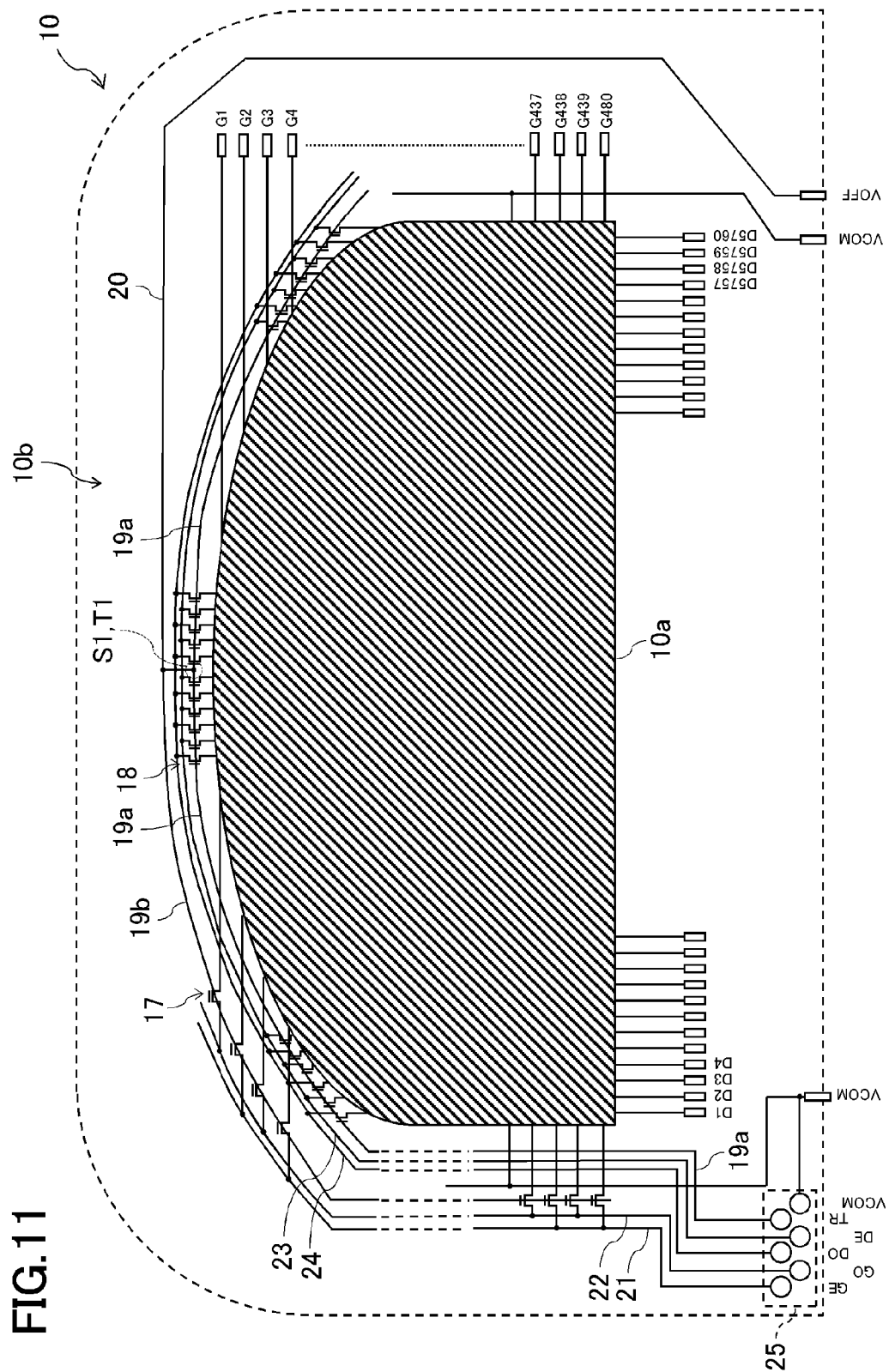
FIG. 11 is a plan view for illustrating still another configuration of the display panel.

The shape of the display region 10a and the arrangement of the test transistors 17 and 18 and various wiring lines are not limited to those in the configurations described above. FIG. 11 is a plan view for illustrating a configuration of the display panel 10 in which the entire upper side of the display region 10a has an arc shape (a semicircular shape). In the configuration of FIG. 11, the branching point S1 of the test control signal supply wiring 19 and the connection point T1 where the gate off-voltage transmission wiring 20 is connected to the test control signal supply wiring 19 occupy the same position, here, a point along a center line in the row direction (left-to-right direction) of the display region 10a.

Figure 12:
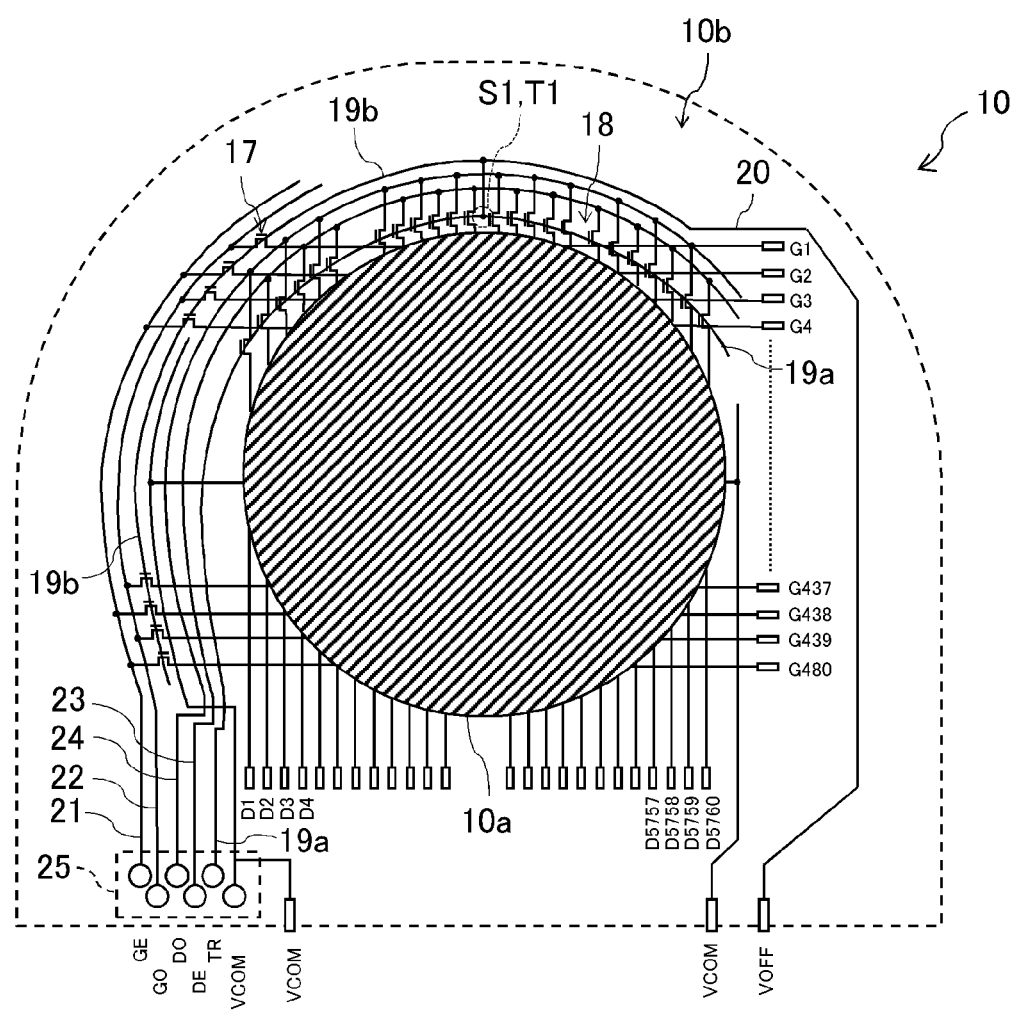
FIG. 12 is a plan view for illustrating yet still another configuration of the display panel.

FIG. 12 is a plan view for illustrating a configuration of the display panel 10 in which the display region 10a is formed to have a circular shape. In the configuration of FIG. 12, similarly to the configuration of FIG. 11, the branching point S1 of the test control signal supply wiring 19 and the connection point T1 where the gate off-voltage transmission wiring 20 is connected to the test control signal supply wiring 19 occupy the same position.

Figure 13:
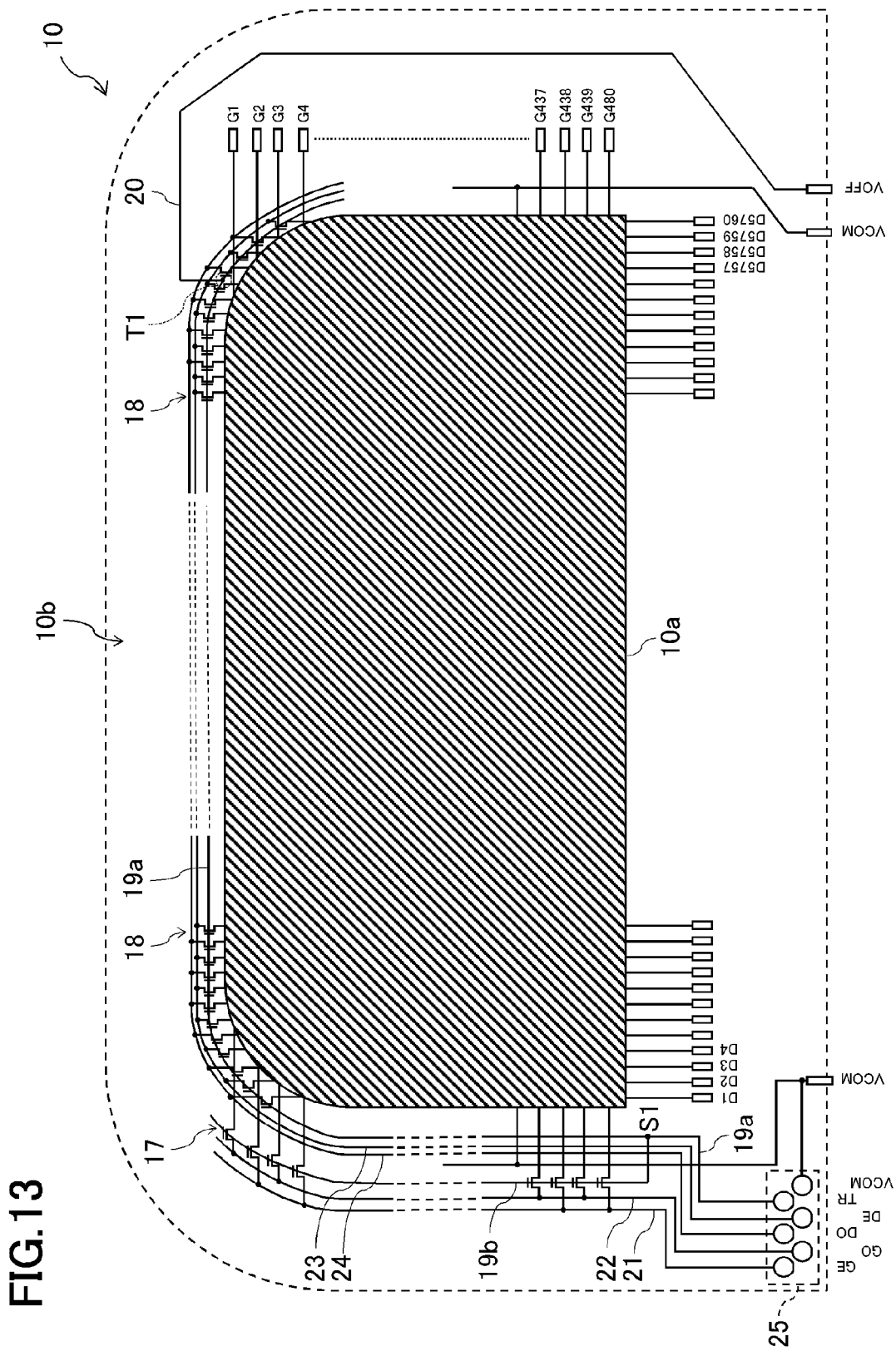
FIG. 13 is a plan view for illustrating a modification example of the display panel of FIG. 5.

FIG. 13 is a modification example of the display panel 10 that is illustrated in FIG. 5. In the configuration of FIG. 13, the branching point S1 of the test control signal supply wiring 19 is located below a shorter side (left side) of the display region 10a. Specifically, the second test control signal supply wiring 19b extends from the branching point S1 of the first test control signal supply wiring 19a along the left side and upper left arc-shaped corner portion of the display region 10a, and is connected to control electrodes of the plurality of test transistors 17 connected to the plurality of gate lines 12.

Figure 3:
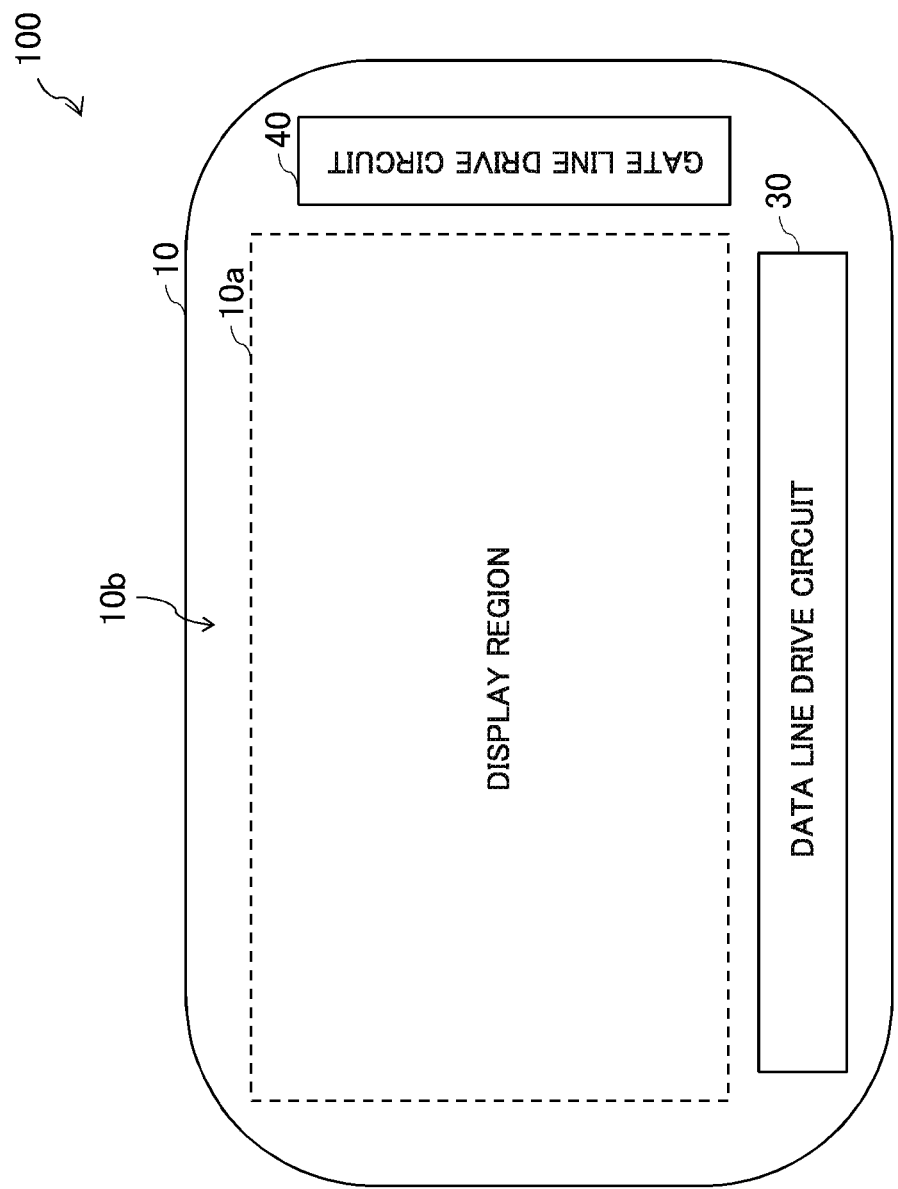
FIG. 3 is a plan view for illustrating still another schematic configuration of the liquid crystal display device.

The configurations described above with respect to the arrangement of the test transistors 17 and 18 and various wiring lines are applicable also to the display panel 10 that has an anomaly shape such as the one illustrated in FIG. 3.

According to the display panel 10 of this embodiment, in a display panel that includes a display region having an anomaly shape and test transistors and test wiring lines arranged in a frame region, it is possible to reduce the area of the frame region and also execute a test of the display panel without fail.

While there have been described what are at present considered to be certain embodiments of the application, it will be understood that various modifications may be made thereto, and it is intended that the appended claims cover all such modifications as fall within the true spirit and scope of the invention.

What is claimed is:
1. An anomalously shaped display panel, comprising:
 a display region having an anomalous shape which is accommodated by the anomalously shaped display panel;
 a plurality of gate lines extending in a row direction:
 a plurality of data lines extending in a column direction;
 a plurality of first test transistors connected to the plurality of gate lines, each of the plurality of first test transistors having a first conducting electrode and a first control electrode, wherein each of the plurality of gate lines is connected to the first conducting electrode of a corresponding one of the plurality of first test transistors;
 a plurality of second test transistors connected to the plurality of data lines, each of the plurality of second test transistors having a second conducting electrode and a second control electrode, wherein each of the plurality of data lines is connected to the second conducting electrode of a corresponding one of the plurality of second test transistors; and
 test control signal supply wiring through which a control signal for turning on the plurality of first test transistors and the plurality of second test transistors and a control signal for turning off the plurality of first test transistors and the plurality of second test transistors are to be supplied,
 wherein first test transistors among the plurality of the first test transistors connected to gate lines crossing an anomaly part of the anomaly shape of the display region among the plurality of gate lines are arranged in other patterns than a straight line, and second test transistors among the plurality of the second test transistors connected to data lines crossing the anomaly part among the plurality of data lines are arranged in other patterns than a straight line, the anomaly part being formed in a non-straight line shape or a curve line shape and wherein the test control signal supply wiring comprises first test control signal supply wiring, which is connected to control electrodes of the plurality of first test transistors, and second test control signal supply wiring, which is branched out from the first test control signal supply wiring and is connected to control electrodes of the plurality of second test transistors.

2. The anomalously shaped display panel according to claim 1, wherein, when the plurality of data lines are longer than the plurality of gate lines, the second test transistors among the plurality of the second test transistors connected to the data lines crossing the anomaly part are placed closer to outside than the first test transistors among the plurality of the first test transistors connected to the gate lines crossing the anomaly part are to the outside, and, when the plurality of gate lines are longer than the plurality of data lines, the first test transistors among the plurality of the first test transistors connected to the gate lines crossing the anomaly part are placed closer to the outside than the second test transistors among the plurality of the second test transistors connected to the data lines crossing the anomaly part are to the outside.

3. The anomalously shaped display panel according to claim 2, wherein the second test control signal supply wiring is placed closer to the outside than the first test control signal supply wiring is to the outside.

4. The anomalously shaped display panel according to claim 3,
wherein the plurality of second test transistors are grouped into a group of at least two second test transistors, and the at least two second test transistors in each group are aligned in a single file in the row direction, and
wherein a plurality of groups of the at least two second test transistors connected to the data lines crossing the anomaly part are arranged in other patterns than a straight line.

5. The anomalously shaped display panel according to claim 4, wherein the plurality of groups of the at least two second test transistors are each arranged between two adjacent gate lines out of the plurality of gate lines.

6. The anomalously shaped display panel according to claim 2, wherein the first test control signal supply wiring is placed closer to the outside than the second test control signal supply wiring is to the outside.

7. The anomalously shaped display panel according to claim 6,
wherein the plurality of first test transistors are grouped into a group of at least two first test transistors, and the at least two first test transistors in each group are aligned in a single file in the column direction, and
wherein a plurality of groups of the at least two first test transistors connected to the gate lines crossing the anomaly part are arranged in other patterns than a straight line.

8. The anomalously shaped display panel according to claim 7, wherein the plurality of groups of the at least two first test transistors are each arranged between two adjacent data lines out of the plurality of data lines.

9. The anomalously shaped display panel according to claim 1, wherein a branching point of the first test control signal supply wiring and the second test control signal supply wiring is located closer to outside than a first gate line, which is arranged at a far end of the display region as an outermost line among the plurality of gate lines, is to the outside.

10. The anomalously shaped display panel according to claim 1, wherein a branching point of the first test control signal supply wiring and the second test control signal supply wiring is located between a first gate line, which is arranged at a far end of the display region as an outermost line among the plurality of gate lines, and a second test transistor that is closest to the first gate line among the plurality of second test transistors that are closer to an outside than the first gate line is to the outside.

11. The anomalously shaped display panel according to claim 1, wherein a branching point of the first test control signal supply wiring and the second test control signal supply wiring is located along a center line in the row direction of the display region.

12. The anomalously shaped display panel according to claim 1, further comprising off-voltage transmission wiring through which an off-voltage for fixing the plurality of first test transistors and the plurality of second test transistors to an off state is to be supplied to the control electrodes of the plurality of first test transistors and the plurality of second test transistors,
wherein the off-voltage transmission wiring is electrically connected to the first test control signal supply wiring.

13. The anomalously shaped display panel according to claim 12, wherein a connection point where the off-voltage transmission wiring is connected to the first test control signal supply wiring and a branching point of the first test control signal supply wiring and the second test control signal supply wiring are located so as to be symmetrical with respect to the row direction in the display region.

14. The anomalously shaped display panel according to claim 12, wherein a connection point where the off-voltage transmission wiring is connected to the first test control signal supply wiring and a branching point of the first test control signal supply wiring and the second test control signal supply wiring are located at the same position.

15. An anomalously shaped display panel, comprising:
a display region having an anomalous shape which is accommodated by the anomalously shaped display panel;
a plurality of gate lines extending in a row direction;
a plurality of data lines extending in a column direction;
a plurality of first test transistors connected to the plurality of gate lines, each of the plurality of first test transistors having a first conducting electrode and a first control electrode, wherein each the plurality of gate lines is connected to the first electrode of a corresponding one of the plurality of first test transistors; and
a plurality of second test transistors connected to the plurality of data lines, each of the plurality of second test transistors having a second conducting electrode and a second control electrode, wherein each of the plurality of data lines is connected to the second conducting electrode of a corresponding one of the plurality of second test transistors,
wherein, out of a set of first test transistors among the plurality of the first test transistors connected to gate lines crossing an anomaly part of the anomaly shape of the display region among the plurality of gate lines are arranged in other patterns than a straight line and a set of second test transistors among the plurality of the second test transistors connected to data lines crossing the anomaly part among the plurality of data lines are arranged in other patterns than a straight line, one set of the test transistors is placed closer to outside than another set of the test transistors is to the outside, and at least one test transistor out of the another set of the test transistors is arranged between two adjacent wiring lines, out of the plurality of gate lines and the plurality of data lines, that are connected to the one set of the test transistors, the anomaly part being formed in a non-straight line shape or a curve line shape.

16. The anomalously shaped display panel according to claim 15, wherein, when the plurality of data lines are longer than the plurality of gate lines, the second test transistors among the plurality of the second test transistors connected to the data lines crossing the anomaly part are placed closer to outside than the first test transistors among the plurality of the first test transistors connected to the gate lines crossing the anomaly part are to the outside, and, when the plurality of gate lines are longer than the plurality of data lines, the first test transistors among the plurality of the first test transistors connected to the gate lines crossing the anomaly part are placed closer to the outside than the second test transistors among the plurality of the second test transistors connected to the data lines crossing the anomaly part are to the outside.

\* \* \* \* \*